United States Patent
Ishizuka et al.

(10) Patent No.: US 9,496,130 B2
(45) Date of Patent: Nov. 15, 2016

(54) RECLAIMING PROCESSING METHOD FOR DELAMINATED WAFER

(75) Inventors: Toru Ishizuka, Annaka (JP); Yuji Okubo, Nishishirakawa (JP);
(Continued)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 14/349,133

(22) PCT Filed: Aug. 29, 2012

(86) PCT No.: PCT/JP2012/005418
§ 371 (c)(1),
(2), (4) Date: Apr. 2, 2014

(87) PCT Pub. No.: WO2013/057865
PCT Pub. Date: Apr. 25, 2013

(65) Prior Publication Data
US 2014/0273400 A1    Sep. 18, 2014

(30) Foreign Application Priority Data
Oct. 17, 2011  (JP) .................................. 2011-227893

(51) Int. Cl.
*H01L 21/02* (2006.01)
*H01L 21/762* (2006.01)

(52) U.S. Cl.
CPC ... *H01L 21/02032* (2013.01); *H01L 21/02087* (2013.01); *H01L 21/76254* (2013.01)

(58) Field of Classification Search
CPC .................... H01L 21/02032; H01L 21/76254; H01L 37/14; H01L 21/02079; H01L
(Continued)

(56) References Cited

U.S. PATENT DOCUMENTS 5,374,564 A    12/1994  Bruel
6,284,628 B1 *  9/2001  Kuwahara et al. ........... 438/459
(Continued)

FOREIGN PATENT DOCUMENTS

CN    101866824 A    10/2010
CN    101877308 A    11/2010
(Continued)

OTHER PUBLICATIONS

Jun. 18, 2015 European Search Report issued in European Application No. 12840892.9.
(Continued)

*Primary Examiner* — Olik Chaudhuri
*Assistant Examiner* — Bitew Dinke
(74) *Attorney, Agent, or Firm* — Oliff PLC

(57) ABSTRACT

The invention provides a reclaiming processing method for a delaminated wafer, by which the delaminated wafer obtained as a by-produce at the time of producing a bonded wafer is subjected to reclaiming polishing and is again available as a bond wafer or a base wafer, wherein, in the reclaiming polishing, the delaminate wafer is polished with use of a double-side polisher in a state that oxide film is not formed on a delaminated surface of the delaminated wafer and oxide film is formed on a back side which is the opposite side of the delaminated surface. As a result, the reclaiming processing method for a delaminated wafer, by which the delaminated wafer obtained as a by-product at the time of manufacturing a bonded wafer based on an ion implantation delamination method is subjected to the reclaiming polishing, which enables sufficiently improving quality.

1 Claim, 1 Drawing Sheet

(75) Inventors: Takuya Sasaki, Nishishirakawa (JP); Akira Araki, Annaka (JP); Nobuhiko Noto, Tokyo (JP)

(58) Field of Classification Search
CPC .......... 21/304;H01L 21/30625; H01L 21/02087; H01L 21/76259; H01L 21/02076
See application file for complete search history.

(56) References Cited

U.S. PATENT DOCUMENTS

| | | | |
|---|---|---|---|
| 6,596,610 B1* | 7/2003 | Kuwabara et al. | 438/458 |
| 2003/0181001 A1* | 9/2003 | Aga et al. | 438/200 |
| 2006/0115986 A1* | 6/2006 | Donohoe et al. | 438/690 |
| 2006/0228846 A1 | 10/2006 | Endo et al. | |
| 2007/0007245 A1 | 1/2007 | Uchida et al. | |
| 2008/0063840 A1 | 3/2008 | Morita et al. | |
| 2008/0124929 A1* | 5/2008 | Okuda et al. | 438/692 |
| 2009/0209085 A1* | 8/2009 | Tamura et al. | 438/458 |
| 2009/0246937 A1* | 10/2009 | Yamazaki et al. | 438/458 |
| 2009/0261449 A1* | 10/2009 | Yamazaki et al. | 257/507 |
| 2010/0190416 A1* | 7/2010 | Schwarzenbach et al. | 451/44 |
| 2010/0200854 A1* | 8/2010 | Alami-Idrissi et al. | 257/49 |
| 2010/0279487 A1* | 11/2010 | Kerdiles et al. | 438/458 |
| 2010/0297828 A1* | 11/2010 | Maleville | H01L 21/76254 438/458 |
| 2011/0086492 A1* | 4/2011 | Ohnuma et al. | 438/455 |
| 2011/0183445 A1* | 7/2011 | Hanaoka et al. | 438/14 |
| 2012/0244679 A1 | 9/2012 | Oka et al. | |
| 2012/0280355 A1* | 11/2012 | Akiyama | 257/507 |
| 2012/0329242 A1* | 12/2012 | Hanaoka et al. | 438/458 |

FOREIGN PATENT DOCUMENTS

| | | |
|---|---|---|
| EP | 1 662 560 A2 | 5/2006 |
| EP | 2 246 882 A1 | 11/2010 |
| JP | A-5-211128 | 8/1993 |
| JP | A-2001-155978 | 6/2001 |
| JP | 2005-072071 A | 3/2005 |
| JP | 2005-072072 A | 3/2005 |
| JP | A-2005-79389 | 3/2005 |
| JP | A-2005-93869 | 4/2005 |
| JP | A-2006-294737 | 10/2006 |
| JP | A-2007-149907 | 6/2007 |
| JP | A-2010-34444 | 2/2010 |
| JP | A-2010-177664 | 8/2010 |
| TW | 200603247 | 1/2006 |
| TW | 201030830 A | 8/2010 |
| TW | 201131625 A | 9/2011 |

OTHER PUBLICATIONS

Jul. 15, 2015 Office Action issued in Taiwanese Application No. 101132517.
Sep. 29, 2015 Office Action issued in Chinese Application No. 201280050352.7.
Feb. 19, 2016 Office Action issued in European Application No. 12 840 892.9.
Feb. 23, 2016 Office Action issued in Taiwanese Application No. 101132517.
Nov. 4, 2014 Office Action issued in Japanese Application No. 2011-227893.
International Search Report issued in International Patent Application No. PCT/JP2012/005418 dated Sep. 25, 2012.

* cited by examiner

RECLAIMING PROCESSING METHOD FOR DELAMINATED WAFER

TECHNICAL FIELD

The present invention relates to a reclaiming processing method for a delaminated wafer that is obtained as a by-product when a bond wafer having hydrogen ions or the like implanted therein is bonded to a base wafer and then delaminated to manufacture a bonded wafer in manufacture of the bonded wafer using an ion implantation delamination method.

BACKGROUND ART

As a method for manufacturing an SOI wafer, especially a method for manufacturing a thin-film SOI wafer that enables improving performance of an advanced integrated circuit, a method for manufacturing an SOI wafer by bonding and then delaminating an ion implanted wafer (an ion implantation delamination method: technology which is also called a smart cut method (a registered trademark)) attracts attention.

According to this ion implantation delamination method, an oxide film is formed on at least one of two silicon wafers, gas ions, e.g., hydrogen ions or rare gas ions are implanted from an upper surface of one silicon wafer (a bond wafer), and an ion implanted layer (which is also referred to as a micro bubble layer or a sealed layer) is formed in the wafer. Subsequently, the surface from which the ions were implanted is pressed against the other silicon wafer (a base wafer) through the oxide film, then a heat treatment (a delamination heat treatment) is applied, and the micro bubble layer is determined as a cleavage plane, and the one wafer (the bond wafer) is delaminated in a thin film form. Further, this is technology for applying a heat treatment (a bonding heat treatment) and effecting strong bonding to manufacture an SOI wafer (see Patent Literature 1). At this stage, an SOI wafer having the cleavage plane (a delaminated surface) serving as a surface of an SOI layer, a small SOT film thickness, and high homogeneity is relatively easily obtained.

Furthermore, according to this ion implantation delamination method, again applying reclaiming processing (re-fresh processing) including surface processing such as polishing or etching to the bond wafer after delamination (a delaminated wafer) enables reducing or eliminating a step produced on an unbonded portion, surface roughness after delamination, or an influence of a remaining implantation layer, and the wafer can be repeatedly used. As regards this reclaiming processing method, for example, like Patent Literature 2, a method for combining chamfering processing with polishing, eliminating an influence of a remaining ion implantation layer present in a chamfered portion, and performing polishing has been suggested.

Moreover, Patent Literature 3 discloses that reclaiming polishing is performed with respect to a delaminated wafer based on double-side polishing with a stock removal of approximately 10 μm (5 μm on each surface of a substrate).

CITATION LIST

Patent Literatures

Patent Literature 1: Japanese Unexamined Patent Application Publication No. H5-211128

Patent Literature 2: Japanese Unexamined Patent Application Publication No. 2001-155978

Patent Literature 3: Japanese Unexamined Patent Application Publication No. 2010-177664

SUMMARY OF INVENTION

Technical Problem

In reclaiming processing of a bond wafer, when a processing stock removal is increased, since a step generated on an unbonded portion, surface roughness due to delamination, an influence of a remaining implantation layer, and others are reduced on a processed surface, quality such as a surface defect can be improved.

However, when the processing stock removal is large, an amount of reduction in wafer thickness due to processing increases, and this thickness deviates from an original wafer thickness (a reference thickness). For example, in a case where a lower limit value is provided with respect to a processible thickness due to a limit in amount of deflection or the like during wafer handling, when a thickness of the delaminated wafer has a value close to the lower limit value, reclaiming processing cannot be performed. Moreover, since a reduction in wafer thickness advances by repeatedly carrying out the reclaiming processing, the number of times of repetition for the reclaiming processing is restricted. In this point of view, a smaller stock removal of the reclaiming processing is desirable. It is ideal to select a minimum processing stock removal that meets quality requirements based on a trade-off relation between the both and suppress a variation in wafer thickness.

As types of polishing for wafer processing, there are roughly single-side polishing and double-side polishing. In the double-side polishing, since a wafer is sandwiched between upper and lower polishing cloths with the use of a double-side polisher and the wafer is polished with a uniform load applied thereto, there can be obtained an advantage that flatness of a wafer, e.g., an amount of edge roll-off (a size of sag at the outermost peripheral portion of the wafer) is improved beyond that in the single-side polishing. When the flatness of the wafer is improved, formation of a defect or a width of an unbonded portion (a terrace width) at an outer peripheral portion at the time of producing a bonded wafer such as an SOI wafer can be also improved, and hence an advantage can be expected for quality of the bonded wafer to be manufactured. However, in the double-side polishing, since both a front side and a back side of the wafer serve as polishing surfaces, when assuring a stock removal determined by a quality request for the wafer surface is tried on the front side, the same stock removal is assured on the back side, and there occurs a problem that a variation is approximately double a necessary stock removal in terms of a wafer thickness.

In view of the above-described problem, it is an object of the present invention to provide a reclaiming processing method for a delaminated wafer by which reclaiming processing that can sufficiently improve quality such as flatness of a delaminated wafer, which is obtained as a by-product at the time of manufacturing a bonded wafer based on the ion implantation delamination method, with a small stock removal is carried out to provide a high-quality reclaimed wafer.

Solution to Problem

To achieve this object, according to the present invention, there is provided a reclaiming processing method for a delaminated wafer, by which the delaminated wafer is subjected to reclaiming polishing and it is again available as a bond wafer or a base wafer, the delaminated wafer being obtained as a by-product at the time of producing a bonded wafer having a thin film on the base wafer by forming an ion implanted layer by ion-implanting at least one type of gas ions selected from hydrogen ions and rare gas ions into a surface of the bond wafer, bonding an ion implanted surface of the bond wafer to a surface of the base wafer directly or through an oxide film, then delaminating the bond wafer at the ion implanted layer, wherein, in the reclaiming polishing, the delaminated wafer is polished with the use of a double-side polisher in a state that the oxide film is not formed on a delaminated surface of the delaminated wafer and the oxide film is formed on a back side which is the opposite side of the delaminated surface.

As described above, since the oxide film is formed on the back side, the back side is hardly polished, but the front side (a delaminated surface on which the oxide film is not formed and a step portion generated on an unbonded portion at an outer periphery thereof) can be subjected to excellent polishing using the double-side polisher. Therefore, it is possible to perform the reclaiming polishing to obtain a wafer with good flatness with a smaller stock removal than that in conventional double-side polishing. Therefore, performing the reclaiming processing with respect to the delaminated wafer in the present invention enables effectively achieving an improvement in quality and a reduction in cost in manufacture of a bonded wafer.

At this time, it is preferable to remove the oxide film other than the oxide film on the back side of the delaminated wafer and then carry out the reclaiming polishing.

As described above, when the oxide film on the chamfered portion or the like except the back side is removed, the delaminated surface can be effectively flattened even if the stock removal of polishing using the double-side polishing is reduced.

Advantageous Effects of Invention

As described above, when the delaminated wafer is subjected to the reclaiming processing based on the present invention, an improvement in quality and a reduction in cost in manufacture of the bonded wafer can be effectively achieved.

DESCRIPTION OF EMBODIMENTS

Although an embodiment according to the present invention will be described in detail with reference to the drawings, the present invention is not restricted thereto.

Figure 1:
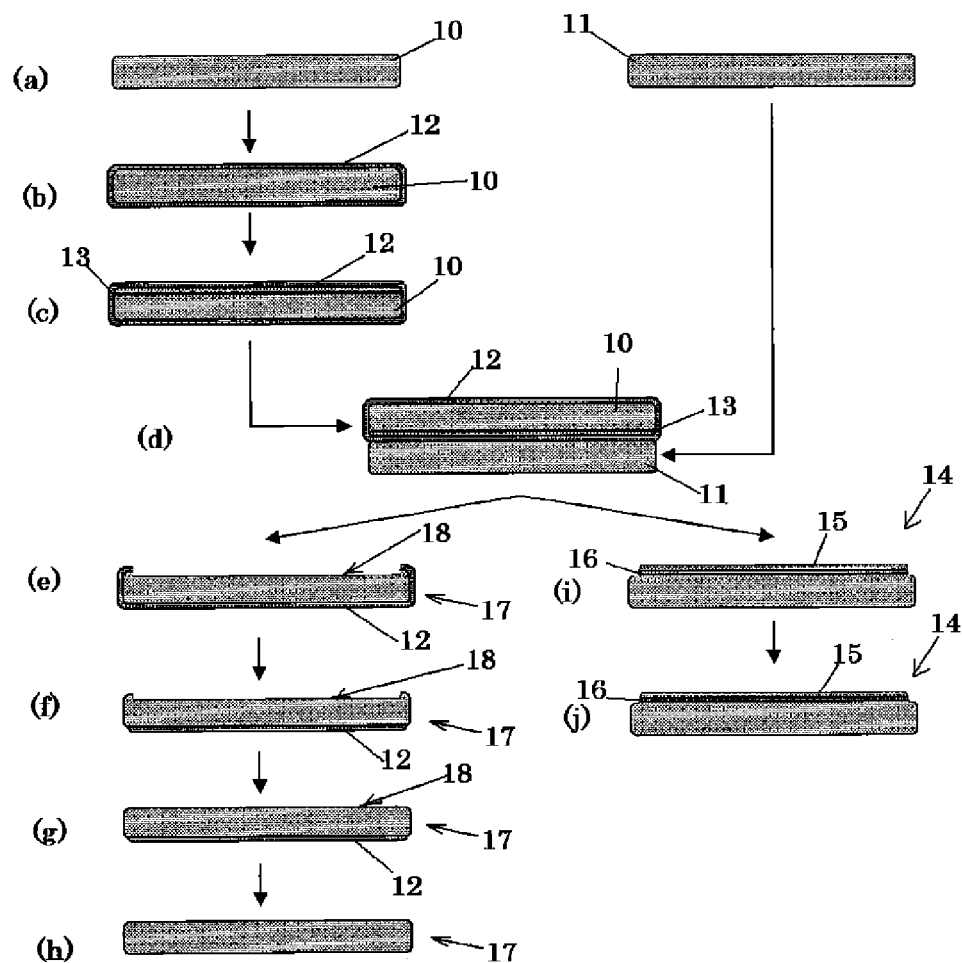
FIG. 1 is a flow diagram showing an example of an embodiment from manufacture of a bonded wafer to reclaiming processing of a delaminated wafer according to the present invention.

FIG. 1 is a flow diagram from manufacture of a bonded wafer to reclaiming of a delaminated wafer based on a reclaiming processing method according to the present invention.

As shown in FIG. 1(a), first, as a bond wafer 10 and a base wafer 11, for example, two silicon single crystal wafers are prepared.

Then, as shown in FIG. 1(b), an oxide film 12 that turns to a buried oxide film 16 is grown on the bond wafer 10 by, e.g., thermal oxidation or CVD. The oxide film 12 that is formed here and turns to the buried oxide film 16 may be formed on one of the wafers or both the wafers, or this oxide film may not be formed in case of manufacturing a directly bonded wafer.

Subsequently, as shown in FIG. 1(c), at least one type of gas ions selected from hydrogen ions and rare gas ions are implanted from above the oxide film 12 by an ion implanter, and an ion implanted layer 13 is formed in the bond wafer 10. At this time, an ion implantation accelerating voltage is selected so that a target thickness of delamination silicon (a thin film 15) can be obtained.

Then, as shown in FIG. 1(d), the ion implanted bond wafer 10 is appressed against and bonded to the base wafer 11 so that the implanted surface can be brought into contact.

Further, the bonded wafer is held at 350° C. to 500° C., a heat treatment for producing a micro bubble layer on an ion implanted layer 13 is carried out, delamination is carried out at the micro bubble layer, and such a bonded wafer 14 having the buried oxide film 16 and a thin film 15 formed on the base wafer 11 as shown in FIG. 1(i) is produced.

It is to be noted that bonding strength of the wafer that was closely pressed at a room temperature can be increased by performing a plasma treatment to surfaces to be bonded in advance and then bonding the surfaces, and mechanical delamination can be effected without carrying out a delamination heat treatment (or by performing a low-temperature heat treatment that delamination does not occur).

Furthermore, as shown in FIG. 1(j), a flattening heat treatment, a bonding heat treatment, polishing, or the like can be performed with respect to this bonded wafer 14 to flatten the delaminated surface or increase the bonding strength.

In the manufacture of the bonded wafer 14 based on the ion implantation delamination method, as shown in FIG. 1(e), a delaminated wafer 17 that is the bond wafer 10 after delamination is obtained as a by-product. The delaminated wafer 17 has a step portion, which was not transferred to the base wafer 11, at an outer peripheral portion of the delaminated surface 18. Such a delaminated wafer 17 is subjected to reclaiming processing so that it can be again used as a bond wafer or a base wafer.

In the present invention, in reclaiming polishing as the reclaiming processing for the delaminated wafer 17, the delaminated wafer 17 is polished by the double-side polisher in a state that the oxide film is not formed on the delaminated surface 18 but the oxide film 12 is formed on the back side that is opposite to the delaminated surface 18 (such a state as shown in FIG. 1(e) or FIG. 1(f)).

As a result, the delaminated surface 18 can be flattened as shown in FIG. 1(g), and a layer damaged by the ion implantation can be eliminated. In the present invention, since the delaminated surface 18 is polished based on double-side polishing, a wafer having high flatness can be obtained. Moreover, since polishing is performed in a state that the delaminated surface 18 has no oxide film formed thereon but the oxide film 12 is formed on the back side, a polishing rate differs depending on each of the front and back sides, and the back side is hardly polished. Therefore, a reduction in the wafer thickness in the reclaiming processing can be decreased while increasing the flatness, the number of times of reclaiming can be increased, and hence both an improvement in quality and a reduction in cost in manufacture of the bonded wafer can be achieved.

Conditions for the double-side polisher are not restricted in particular, a reduction in polishing rate due to the oxide film on the back side is considerable (polishing is hardly performed) even under normal conditions, and hence the front side where a silicon surface is substantially exposed (the delaminated surface the step portion) alone is polished. It is needless to say that ingenuity, e.g., selecting a polishing material or a polishing pad that further reduces the polishing rate on the back side may be exercised.

When such conditions are selected, the reclaimed wafer subjected to the single-side polishing using the double-side polisher can eventually obtain the same values of quality items such as flatness as those of a wafer subjected to regular double-side polishing. Surface defect quality of a wafer, quality of surface unevenness, and shape quality of an outer peripheral portion directly affect formation of a defect or a state of an unbonded portion in wafer bonding, and hence they are important management items. As regards these items, to obtain the same quality as the wafer subjected to the regular double-side polishing, the double-side polisher is adjusted. This is far efficient and realistic as compared with adjusting the single-side polisher to obtain the same quality.

Further, in the reclaiming polishing, after performing the polishing using the double-side polisher, carrying out finish polishing for surface state adjustment is also preferred. In the present invention, since a stock removal of polishing performed by the double-side polisher can be reduced, such finish polishing can be sufficiently carried out. Furthermore, before or after effecting the polishing using the double-side polisher, polishing a chamfered portion is preferred. As a result, the remaining ion implantation layer in the chamfered portion can be assuredly removed. Conditions for polishing of the chamfered portion or the finish polishing are not restricted in particular, and the same conditions as those in a regular polishing process can be used in the reclaiming processing.

If the above-described reclaiming processing method according to the present invention is a method for manufacturing the bonded wafer 14 by which the oxide film 12 is formed on the bond wafer 10 and then delaminated, since a state that the oxide film remains on the back side and the delaminated surface has no oxide film formed thereon is achieved after delamination as shown in FIG. 1(e), performing the double-side polishing based on cleaning without removing the oxide film on the back side enables most efficiently realizing the reclaiming polishing according to the present invention, thereby reducing a processing cost. However, the oxide film formed on the back side according to the present invention is not restricted to an oxide film formed in a bonded wafer manufacturing process, and it may be formed on the back side by, e.g., thermal oxidation or CVD before the reclaiming polishing.

Moreover, as shown in FIG. 1(f), it is preferable to remove the oxide film other than the oxide film on the back side which is the opposite side of the delaminated surface 18 of the delaminated wafer before the reclaiming polishing (FIG. 1(g)) as the reclaiming processing for the delaminated wafer 17.

As shown in FIG. 1(e), when the oxide film 12 is formed on the bond wafer 10 in the bonded wafer manufacturing process, since the back side already has the oxide film 12 formed thereon, the wafer can be directly put into the double-side polisher and subjected to the double-side polishing as described above. However, in the delaminated wafer 17, since the oxide film 12 left at the time of the delamination also remain on the chamfered portion at the outer periphery of the wafer, previously removing such an oxide film 12 on the chamfered portion enables efficiently flattening the delaminated surface 18 side with a smaller stock removal in the double-side polishing and the polishing of the chamfered portion which are post-processes, and the remaining ion implantation layer of the chamfered portion can be assuredly removed.

Additionally, in a case where the bonded wafer was manufactured without forming the oxide film on the bond wafer, or after the delamination, when the oxide film on the entire surface including the oxide film on the back side is removed by performing cleaning which is of a batch processing HF tank immersion type that is usually carried out, the oxide film must be formed on the back side of the delaminated wafer by thermal oxidation or CVD in the present invention. In this case, executing the oxide film removing process is preferred.

In the regular batch processing oxidation film formation, since the oxide films are formed on the entire front and back sides and the oxide film grows on the chamfered portion and near the outer periphery of the front side due to wraparound even in the CVD, carrying out the process for removing the oxide film other than that on the back side is preferred.

As this oxide film removing method, for example, it is preferable to remove the oxide film on the front side (the delaminated surface+the step portion) or the chamfered portion alone by performing cleaning using an aqueous HF solution (HF cleaning).

At this time, when the HF cleaning was performed in a system that the wafer is simply immersed in a regular batch processing aqueous HF solution tank, the oxide film including that on the back side is removed.

Figure 2:
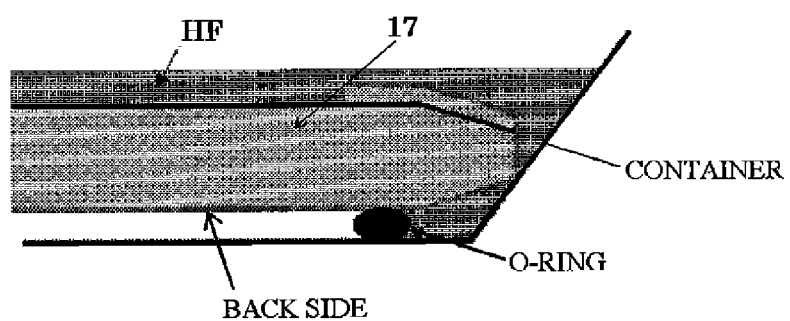
FIG. 2 is a schematic view showing an apparatus that can be used at the time of removing an oxide film in the reclaiming processing of the delaminated wafer according to the present invention.

Thus, it is preferable to bring a ring-shaped rubber (an O-ring) into contact with an entire circumference near the outer periphery on the back side and protect the inner side (the back side of the wafer) against contact with the aqueous HF solution by using such a cleaning apparatus as shown in FIG. 2 so that the aqueous HF solution spreads to the front side of the wafer and the chamfered portion and does not flow to the back side.

At this time, a regular single wafer processing spin type single-side cleaner can be used. However, to secure removal of the oxide film using the aqueous HF solution on the chamfered portion, removal of the remaining ion implantation layer on the chamfered portion in the reclaiming polishing, and suppression of flowing of the aqueous HF solution toward the back side, it is desirable to use an apparatus having a function for bringing the ring-shaped rubber into contact with the peripheral portion of the back side and avoiding the flowing of the aqueous HF solution.

Further, as shown in FIG. 1(h), at last or immediately after performing the double-side polishing, when the HF cleaning like the regular batch processing HF liquid tank immersion type is performed, the oxide film 12 on the back side can be removed, and a reclaimed wafer having the same front side and back side quality as that of an initial wafer can be produced.

When the delaminated wafer is subjected to the reclaiming processing based on the above-described present invention, it is possible to achieve an improvement in quality and a reduction in cost in manufacture of the bonded wafer.

EXAMPLES

Although the present invention will now be more specifically described hereinafter based on examples and comparative examples, the present invention is not restricted thereto.

Example 1

As a bond wafer, a silicon single crystal wafer having a diameter of 300 mm, a wafer thickness of 775 μm, and no COP was prepared. $5\times10^{16}$ atoms/cm$^2$ of H$^+$ ions were implanted into a bare surface of this wafer with acceleration energy of 50 keV by using an ion implanter. As a base wafer, a silicon single crystal wafer having a diameter of 300 mm and a wafer thickness of 775 μm was used, and a thermal oxide film of 145 nm was formed.

An implanted surface of the bond wafer was determined as a bonding surface and pressed against a front surface of a thermal oxide film of the base wafer, then a heat treatment was performed at a loading temperature of 200° C. and a maximum temperature of 500° C. in a batch processing horizontal heat treatment furnace, the bond wafer was delaminated from an ion implanted layer, and an SOI layer was formed on the base wafer.

An oxide film of 1 μm was deposited and formed on a back side alone of the delaminated bond wafer by the CVD. This wafer was polished with the use of a double-side polisher. A stock removal on a front side based on the polishing was 3.0 μm, and a variation in wafer thickness at this moment was also 3.0 μm. After the double-side polishing, polishing of a chamfered portion and finish polishing were performed.

Particles on the wafer surface after the finish polishing were measured by a laser scattering type particle measuring instrument, and a counting result obtained when a particle diameter was 0.12 μmup was 1/piece. An amount of edge roll-off of this wafer was measured by a surface laser reflection type flatness measuring instrument, a value of 100 nm was obtained. A wafer thickness was measured by a capacitance type wafer shape measuring instrument, a result was 772 μm.

The HF cleaning which is of the batch processing HF chemical solution tank immersion type was applied to the obtained reclaimed wafer, the oxide film on the back side was removed, the SOI wafer manufacturing process including oxidation, ion implantation, bonding, and delamination was carried out again as a bond wafer under the same conditions, and thereafter the reclaiming processing was effected under the same conditions. When this process was repeated for a total of five times, the number of particles and an amount of edge roll-off of the obtained reclaimed wafer had the same values as those in the first reclaiming processing, and a wafer thickness was 760 μm.

Example 2

As a bond wafer, a silicon single crystal wafer having a diameter of 300 mm, a wafer thickness of 775 μm, and no COP was prepared, a thermal oxide film of 145 nm was grown, then $5\times10^{16}$ atoms/cm$^2$ of H$^+$ ions were implanted with acceleration energy of 50 keV by using an ion implanter. As a base wafer, a silicon single crystal wafer having a diameter of 300 mm and a wafer thickness of 775 μm was used, and a thermal oxide film was not formed.

An implanted surface was determined as a bonding surface and pressed against the base wafer, then a heat treatment was performed at a loading temperature of 200° C. and a maximum temperature of 500° C. in a batch processing horizontal heat treatment furnace, the bond wafer was delaminated from an ion implanted layer, and an SOI layer was formed on the base wafer.

Oxide films on the front side and a chamfered portion of the delaminated bond wafer were removed by using a single wafer processing HF cleaner (FIG. 2), and an oxide film on a back side was allowed to remain as it is. This wafer was polished with the use of a double-side polisher. A stock removal on the front side based on the polishing was 3.0 μm, and a variation in wafer thickness at this moment was also 3.0 μm. After the double-side polishing, polishing of a chamfered portion and finish polishing were performed. Particles on the wafer surface after the polishing were measured by a laser scattering type particle measuring instrument, and a counting result obtained when a particle diameter was 0.12 μmup was 1/piece. An amount of edge roll-off of this wafer was measured by a surface laser reflection type flatness measuring instrument, and a value of 100 nm was obtained. A wafer thickness was measured by a capacitance type wafer shape measuring instrument, and a result was 772 μm.

The HF cleaning which is of the batch processing HF chemical solution tank immersion type was applied to the obtained reclaimed wafer, the oxide film on the back side was removed, the SOI wafer manufacturing process including oxidation, ion implantation, bonding, and delamination was carried out again as a bond wafer under the same conditions, and thereafter the reclaiming processing was effected under the same conditions. When this process was repeated for a total of five times, the number of particles and an amount of edge roll-off of the obtained reclaimed wafer had the same values as those in the first reclaiming processing, and a wafer thickness was 760 μm.

Comparative Example 1

A silicon single crystal wafer having a diameter of 300 mm, a wafer thickness of 775 μm, and no COP was prepared as a bond wafer like Examples 1 and 2, and oxidation, ion implantation, and delamination were carried out under the same conditions as those in Example 2.

HF cleaning which is of the batch processing HF chemical solution tank immersion type was applied to the delaminated bond wafer, and oxide films on the front side and a chamfered portion thereof were removed. This wafer was placed in a double-side polisher and polished. A stock removal on the front side based on the polishing was 3.0 μm, and a variation in wafer thickness at this moment was 6.0 μm. After the double-side polishing, polishing of the chamfered portion and finish polishing were performed under the same conditions as Examples 1 and 2. Particles on the wafer surface after the polishing were measured by a laser scattering type particle measuring instrument, and a counting result obtained when a particle diameter was 0.12 μmup was 1/piece. An amount of edge roll-off of this wafer was measured by a surface laser reflection type flatness measuring instrument, and a value of 100 nm was obtained. A wafer thickness was measured by a capacitance type wafer shape measuring instrument, and a result was 769 μm.

The regular batch processing RCA cleaning was applied to the obtained reclaimed wafer, then the SOI wafer manufacturing process including oxidation, ion implantation, bonding, and delamination was carried out again as a bond wafer under the same conditions, and thereafter the reclaiming processing was effected under the same conditions. When this process was repeated for a total of five times, the number of particles and an amount of edge roll-off of the obtained reclaimed wafer had the same values as those in the first reclaiming processing, and a wafer thickness was 745 µm. A wafer thickness of a product class having a standard of 775 µm±25 µm as a wafer thickness standard was disqualified.

Comparative Example 2

A silicon single crystal wafer having a diameter of 300 mm, a wafer thickness of 775 µm, and no COP was prepared as a bond wafer like Examples 1 and 2 and Comparative Example 1, and oxidation, ion implantation, and delamination were carried out under the same conditions as those in Example 2.

HF cleaning which is of the batch processing HF chemical solution tank immersion type was applied to the delaminated bond wafer, and oxide films on a front side, a chamfered portion, and a back side thereof were removed. This wafer was placed in a single-side polisher and its front side alone was polished. A stock removal on the front side based on the polishing was 3.0 µm, and a variation in wafer thickness at this moment was 3.0 µm. After the single-side polishing, polishing of the chamfered portion and finish polishing were performed under the same conditions as Examples 1 and 2. Particles on the wafer surface after the polishing were measured by a laser scattering type particle measuring instrument, and a counting result obtained when a particle diameter was 0.12 µmup was 1/piece. An amount of edge roll-off of this wafer was measured by a surface laser reflection type flatness measuring instrument, and a value that is as high as 420 nm was obtained. A wafer thickness was measured by a capacitance type wafer shape measuring instrument, and a result was 772 µm.

The regular batch processing RCA cleaning was applied to the obtained reclaimed wafer, then the SOI wafer manufacturing process including oxidation, ion implantation, bonding, and delamination was carried out again as a bond wafer under the same conditions, and thereafter the reclaiming processing was effected under the same conditions. When this process was repeated for a total of five times, the number of particles of the obtained reclaimed wafer had the same value but an amount of edge roll-off of the same was degraded and had a high value of 485 nm. A wafer thickness was 760 µm.

As an influence of the degradation of the amount of edge roll-off, an increase in terrace width was observed. That is, in regard to an SOI wafer produced by using a wafer obtained by performing the reclaiming processing for five times as a bond wafer, a terrace width measured at a position on the opposite side of a notch was 1.2 mm in Examples 1 and 2 and Comparative Example 1, but this value was increased to 2.2 mm in Comparative Example 2.

It is to be noted that the present invention is not restricted to the foregoing embodiment. The foregoing embodiment is just an illustrative example, and any example that has substantially the same configuration and exercises the same functions and effects as the technical concept described in claims of the present invention is included in the technical scope according to the present invention.

The invention claimed is:

1. A reclaiming processing method for a delaminated wafer, by which the delaminated wafer is subjected to reclaiming polishing and it is again available as a bond wafer or a base wafer, the delaminated wafer being obtained as a by-product at the time of producing a bonded wafer having a thin film on the base wafer by forming an ion implanted layer by ion-implanting at least one type of gas ions selected from hydrogen ions and rare gas ions into a surface of a bond wafer, bonding an ion implanted surface of the bond wafer to a surface of the base wafer directly or through an oxide film, then delaminating the bond wafer at the ion implanted layer, wherein a delaminated surface on which the oxide film is not formed and a step portion generated on an unbonded portion at an outer periphery of the delaminated wafer are subjected to polishing by performing double-side polishing using a double-side polisher in a state that the oxide film is not formed on the delaminated surface of the delaminated wafer and the oxide film is formed on a back side which is the opposite side of the delaminated surface, wherein the oxide film other than the oxide film on the back side of the delaminated wafer is removed, and then the reclaiming polishing is carried out.

\* \* \* \* \*